(12) United States Patent
Ikeda (10) Patent No.: US 10,596,807 B2
(45) Date of Patent: Mar. 24, 2020

(54) CAPACITIVE LOAD DRIVING CIRCUIT AND IMAGE FORMING APPARATUS

(71) Applicant: FUJI XEROX CO., LTD., Tokyo (JP)

(72) Inventor: Chikaho Ikeda, Ebina (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 16/143,722

(22) Filed: Sep. 27, 2018

(65) Prior Publication Data

US 2019/0283401 A1    Sep. 19, 2019

(30) Foreign Application Priority Data

Mar. 19, 2018    (JP) .................. 2018-051676

(51) Int. Cl.
*B41J 2/045*    (2006.01)
*H03K 17/687*    (2006.01)
(Continued)

(52) U.S. Cl.
CPC ......... *B41J 2/04541* (2013.01); *B41J 2/0457* (2013.01); *B41J 2/04555* (2013.01);
(Continued)

(58) Field of Classification Search
CPC ............... B41J 2/04541; B41J 2/04548; B41J 2/04555; B41J 2/0457; B41J 2/04581;
(Continued)

(56) References Cited

U.S. PATENT DOCUMENTS 5,889,427 A * 3/1999 Nakajima .......... H03K 17/6872
                                                                327/536
6,046,613 A    4/2000 Tamura
(Continued)

FOREIGN PATENT DOCUMENTS

JP    H11-170529    6/1999
JP    3436296    6/2003
(Continued)

OTHER PUBLICATIONS

English language abstract and machine translation of JP 2006-256149.

*Primary Examiner* — Jannelle M Lebron (74) *Attorney, Agent, or Firm* — Fildes & Outland, P.C.

(57) ABSTRACT

A capacitive load driving circuit includes a first switching element, a second switching element, a third switching element, a fourth switching element and voltage dropper elements. The first switching element is provided on a first charging path extending from a power supply to a capacitive load. The second switching element is provided on a second charging path extending from a capacitor to the capacitive load. The third switching element is provided on a first discharging path extending from the capacitive load to a ground. The fourth switching element is provided on a second discharging path extending from the capacitive load to the capacitor. The voltage dropper elements are provided on each of control signal power supply paths to the first switching element, to the second switching element, to the third switching element and to the fourth switching element. The voltage dropper elements are configured to make electric current flow more easily through the second charging path than through the first charging path when charging the capacitive load and to make electric current flow more easily through the second discharging path than through the first discharging path when discharging the capacitive load by a potential difference.

8 Claims, 5 Drawing Sheets

(51) Int. Cl.
  *H03F 3/45* (2006.01)
  *H03K 17/66* (2006.01)
(52) U.S. Cl.
  CPC ....... *H03K 17/6872* (2013.01); *B41J 2/04581* (2013.01); *H03F 3/45071* (2013.01); *H03K 17/667* (2013.01)
(58) Field of Classification Search
  CPC .............. H03K 17/6872; H03K 17/667; H03F 3/45071
  See application file for complete search history.

(56) References Cited

U.S. PATENT DOCUMENTS

| | | | | |
|---|---|---|---|---|
| 6,064,243 | A | * | 5/2000 | Matsuda ............ H03K 17/6872 327/156 |
| 2010/0238210 | A1 | | 9/2010 | Oshima et al. |
| 2014/0091324 | A1 | * | 4/2014 | Zushi .................. H03K 17/166 257/77 |

FOREIGN PATENT DOCUMENTS

| | | |
|---|---|---|
| JP | 2006-256149 | 9/2006 |
| JP | 4811483 | 9/2011 |

* cited by examiner

CAPACITIVE LOAD DRIVING CIRCUIT AND IMAGE FORMING APPARATUS

CROSS REFERENCE TO RELATED APPLICATION

This application is based on and claims priority under 35 USC 119 from Japanese Patent Application No. 2018-051676 filed Mar. 19, 2018.

BACKGROUND

Technical Field

The present invention relates to a capacitive load driving circuit and an image forming apparatus.

Related Art

JP-A-H11-170529 discloses providing a regenerative capacitor in addition to a capacitive load. The regenerative capacitor is charged when performing discharging of the capacitive load, and discharged when performing charging of the capacitive load for recovering energy to reduce energy consumption.

JP-A-2006-256149 discloses charging a capacitive load using two different voltage levels by switching between series and parallel connection with a switch for switching between two capacities, and recovering energy by charging the two capacities when performing discharging of the capacitive load.

SUMMARY

For reducing power consumption and preventing rise in temperature by switching between a power supply and a regenerative capacitor, it may be necessary to provide a circuit for switching, resulting in increasing the number of components and control burden.

Aspects of non-limiting embodiments of the present disclosure relate to reduce the number of components compared to a case where a circuit configured to sequentially switch over individual transistors is provided or a circuit for charging a capacitor is provided.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a capacitive load driving circuit including: a first switching element that is provided on a first charging path extending from a power supply to a capacitive load; a second switching element that is provided on a second charging path extending from a capacitor to the capacitive load; a third switching element that is provided on a first discharging path extending from the capacitive load to a ground; a fourth switching element that is provided on a second discharging path extending from the capacitive load to the capacitor; and voltage dropper elements that are provided on each of control signal power supply paths to the first switching element, to the second switching element, to the third switching element and to the fourth switching element and that are configured to make electric current flow more easily through the second charging path than the first charging path when charging the capacitive load and to make electric current flow more easily through the second discharging path than the first discharging path when discharging the capacitive load by a potential difference.

BRIEF DESCRIPTION OF DRAWINGS

Exemplary embodiments of the present invention will be described in detail based on the following figures, wherein.

DETAILED DESCRIPTION

Summary of Apparatus

Figure 1:
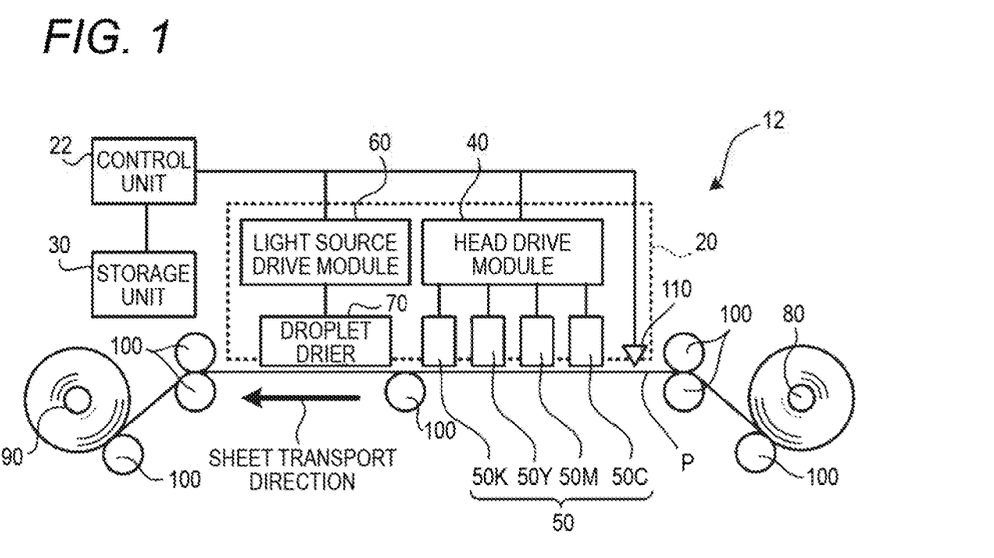
FIG. 1 is a schematic diagram of an inkjet recorder according to an exemplary embodiment of the invention.

FIG. 1 is a schematic block diagram showing a main structural pan of an inkjet recording device 12 according to an exemplary embodiment of the invention.

The inkjet recording device 12 includes an image forming unit 20, a control unit 22, a storage unit 30, a sheet feed roll 80, a sheet discharge roll 90 and transport rollers 100.

The image forming unit 20 includes, for example, a head drive module 40, a printhead 50, a light source drive module 60, a droplet drier 70 and a sheet speed detection sensor 110.

The sheet speed detection sensor 110 is disposed in, for example, a position that faces an image forming surface of a sheet P to detect a transport speed of the sheet P in a sheet transport direction and informs the control unit 22 of the detected sheet transport speed.

The control unit 22 controls the rotation of the transport rollers 100 that are connected to a sheet transport motor, not shown, via mechanisms such as gears by driving the sheet transport motor. The sheet P, which is continuously long in the sheet transport direction, is wound around the sheet feed roll 80 as a recording medium, and the sheet P is conveyed in the sheet transport direction as the transport rollers 100 rotate.

The control unit 22, for example, acquires image data stored in the storage unit 30 and controls the image forming unit 20 based on color information from each of pixels of an image contained in the image data to thereby form an image corresponding to the image data on the image forming surface of the sheet P.

Specifically, the control unit 22 controls the head drive module 40. Then, the head drive module 40 drives the printhead 50 connected to the head drive module 40 to eject droplets of ink from the printhead 50 according to an ink droplet ejection timing indicated by the control unit 22 to thereby form an image corresponding to the image data on the image forming surface of the sheet P, which is one of surfaces of the sheet P.

The printhead 50 includes four printheads 50Y, 50M, 50C, 50K that correspond to four colors, yellow (Y), magenta (M), cyan (C) and black (K), respectively. Then, ink droplets of Y, M, C and K are ejected from the printhead 50.

Figure 2:
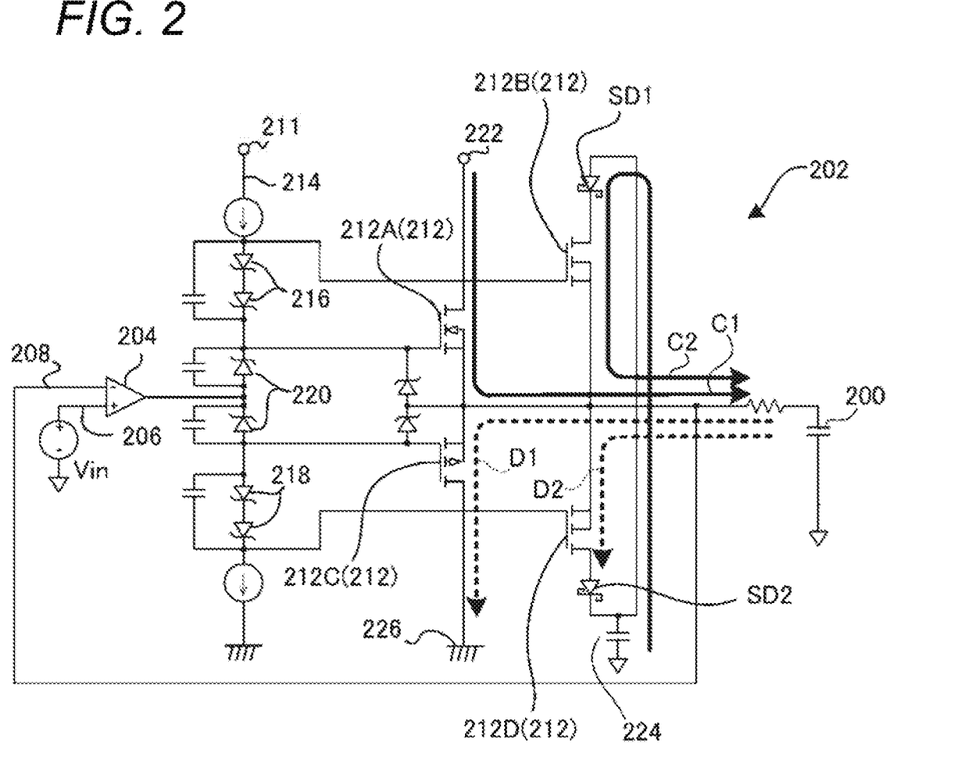
FIG. 2 is a circuit diagram of a capacitive load driving circuit according to the exemplary embodiment which is configured to drive a capacitive load for ejecting a droplet of ink.

Here, a method for driving the printhead 50 to eject ink in the form of a droplet according to the exemplary embodiment is executed by charging and discharging the capacitive load 200 (see FIG. 2). A piezoelectric element is adopted as the capacitive load 200.

The light source drive module 60 includes a switching element such as an FET (Field Effect Transistor), which is included in the droplet drier 70, configured to on-off control an amount of light emitted from, for example, a semiconductor light emitting device (not shown). The switching element is driven based on an instruction from the control unit 22.

The control unit 22 controls the light source drive module 60 so that the droplet drier 70 radiates a laser beam or a light beam of an infrared lamp towards the image forming surface of the sheet P to dry ink droplets making up the image formed on the sheet P, whereby the image is fixed to the sheet P. Additionally, the control unit 22 on-off controls the radiation of the laser beam or the infrared lamp beam by controlling, for example, the hourly average of a driving current of the semiconductor light emitting device based on image information. Alternatively, the light output of the semiconductor light emitting device or the infrared lamp may be controlled by controlling the magnitude of the hourly average of the driving current.

Then, the sheet P is transported to the sheet discharge roll 90 as the transport rollers 100 rotate to be wound around the sheet discharge roll 90.

Capacitive Load Driving Circuit

FIG. 2 shows a capacitive load driving circuit 202 configured to drive a capacitive load 200 for ejecting droplets of ink from the printhead 50 (see FIG. 1).

A signal line 206 for an input voltage Vin that depends on image information and a signal line 208 for negative feedback of a driving voltage of the capacitive load 200 are connected to an input end of a differential amplifier 204 shown at a leftmost end of FIG. 2. The driving of the capacitive load 200 is controlled based on a drive signal output from an output end of the differential amplifier 204.

Although a detailed description of connections of components making up the capacitive load driving circuit 202 shown in FIG. 2 is omitted here, connections of electronic components disposed along main wiring paths of lite circuit will be described.

Control Signal Paths

In this exemplary embodiment, the capacitive load driving circuit 202 incorporates four switching elements 212 and includes a control signal path 214 originating from a first supply voltage 211 and configured to be on (opening) or off (closing) in response to a control signal.

In FIG. 2, two n-type MOSFETs (referred to as a first switching element 212A and a second switching element 212B) are adopted to charge the capacitive load 200. Additionally, in FIG. 2, two p-type MOSFETs (referred to as a third switching element 212C and a fourth switching element 212D) are adopted to discharge the capacitive load 200.

A voltage from the control signal path 214 is applied to respective gates of the switching elements 212 according to a drive signal from the differential amplifier 204 as a control signal.

In the control signal path 214, a first voltage dropper element 216 (in this exemplary embodiment, two diodes) is interposed between the gate of the first switching element 212A and the gate of the second switching element 212B. The gate of the first switching element 212A is connected to a low potential side of the first voltage dropper element 216, while the gate of the second switching element 212B is connected to a high potential side of the first voltage dropper element 216. Connecting the two diodes in series with each other means that a potential difference in this exemplary embodiment becomes greater than that in modified examples, which will be described later, in which only one diode is provided.

The first switching element 212A and the second switching element 212B are both n-type MOSFETs and are commonly connected to the capacitive load at their sources. As a result, a resistance of the second switching element 212B having the higher potential becomes lower than a resistance of the first switching element 212A having the lower potential while the output potential of the differential amplifier 204 is rising to charge the capacitive load 200. A diode SD1 remains on while the potential of the capacitor is higher than the potential of the capacitive load, whereby charging current is mainly caused to flow from the capacitor to the capacitive load. Then, the diode SD1 starts to be off when the potential of the capacitive load approaches the capacitor potential. A further rise in the potential of the differential amplifier 204 reduces the resistance of the switching element 212A, causing the diode SD1 to be switched off, whereby the capacitive load 200 is charged only by a power supply 222.

Additionally, in the control signal path 214, a second voltage dropper element 218 (in this embodiment, two diodes) is interposed between the gate of the third switching element 212C and the gate of the fourth switching element 212D. The gate of the third switching element 212C is connected to a high potential side of the second voltage dropper element 218, while the gate of the fourth switching element 212D is connected to a low potential side of the second voltage dropper element 218. Connecting the two diodes in series with each other means that a potential difference in this embodiment becomes greater than that in the later modified examples in which only one diode is provided.

The third switching element 212C aid the fourth switching element 212D are both p-type MOSFETs and are commonly connected to the capacitive load at their sources. As a result, while the output potential of the differential amplifier 204 is falling to discharge the capacitive load 200, a resistance of the fourth switching element 212D having the lower potential becomes lower than a resistance of the third switching element 212C having the higher potential. A diode SD2 remains on while the capacitor potential is lower than that of the capacitive load, whereby discharging current is caused to flow mainly from the capacitive load to the capacitor. Then, the diode SD2, which is incorporated in the series circuit of the capacitor and the p-type MOSFET 212D, starts to be off when the potential of the capacitive load approaches the potential of the capacitor. A further fall in the potential of the differential amplifier 204 reduces the resistance of the switching element 212C, causing the diode SD2 to be switched off, whereby the capacitive load is discharged only to a GND 226.

A pair of third voltage dropper elements 220 (in this embodiment, Zener diodes) is interposed between the gate of the first switching element 212A and the third switching element 212C so as to be disposed about a connecting point to the control signal path 214 at the output end of the differential amplifier 204. The third voltage dropper elements 220 prevent the n-type MOSFET 212B and the p-type MOSFET 212D as well as the n-type MOSFET 212A and the p-type MOSFET 212C from being switched on simultaneously as a result of the n-type MOSFET 212B and the p-type MOSFET 212D as well as the n-type MOSFET 212A and the p-type MOSFET 212C performing a class-B push-pull operation upon an input of a voltage at the gates of the switching elements 212. Thus, the third voltage dropper elements 220 prevent current from flowing directly from the power supply 222 to the GND 226 wastefully. In the class-B push-pull operation, however, there is caused a drawback of generating a crossover distortion when the transistors are switched over. To cope with this drawback, the differential amplifier 204 is caused to perform a negative feedback, and the third voltage dropper elements 220 function not only to hold the class-B push-pull operation so that the transistors are switched over within a short period of time when the transistors are switched over from charging to discharging or discharging to charging but also to provide a minimum potential difference at which both the transistors are prevented from being switched on altogether to suppress the influence of the cross over as low as possible.

First Charging Path

The first switching element 212A establishes a first charging path (a path indicated by an arrow C1 in FIG. 2) through which a voltage to be applied to the capacitive load 200 is passed from the second power supply 222 to the capacitive load 200 when the first switching element 212A is switched on. In other words, the first charging path C1 constitutes the path through which the capacitive load 200 is charged by the voltage from the second power supply 222.

Second Charging Path

The second switching element 212B establishes a second charging path (a path indicated by an arrow C2 in FIG. 2) through which the capacitive load 200 is charged by a regenerative capacitor 224 when the second switching element 212B is switched on. In other words, the second charging path C2 constitutes the path through which the capacitive load 200 is charged by a voltage discharged from the regenerative capacitor 224 when the second charging path C2 is switched on.

First Discharging Path

The third switching element 212C establishes a first discharging path (a path indicated by an arrow D1 in FIG. 2) through which the capacitive load 200 is discharged to the ground 226 when the third switching element 212C is switched on. In other words, the first discharging path D1 constitutes the path through which charge carriers of the capacitive load 200 are passed to the ground 226 for discharge.

Second Discharging Path

The fourth switching element 212D establishes a second discharging path (a path indicated by an arrow D2 in FIG. 2) through which the capacitive load 200 is discharged to the regenerative capacitor 224 when the fourth switching element 212D is switched on. In other words, the second discharging path D2 constitutes the path through which charge carriers of the capacitive load 200 are passed to the regenerative capacitor 224 for charge.

The first switching element 212A and the second switching element 212B are switched on when a drive signal rises. Due to the resistance of the second switching element 212B being lower than that of the first switching element 212A, when the regenerative capacitor 224 is charged enough, the capacitive load 200 starts to be charged by electric charge stored in the regenerative capacitor 224 preferentially. Then, the diode SD1 disposed between the second switching element 212B and the regenerative capacitor 224 starts to be off when the capacitive load is charged to such an extent that the potential of the capacitive load approaches the potential of the regenerative capacitor. Thereafter, a further rise in the potential output from the amplifier 204 raises the control potential of the switching element 212A, whereby the on-state resistance of the first switching element 212A falls, causing the diode SD1 to be switched off. Then, the capacitive load comes to be charged only by the second power supply 222 (see arrows A in FIG. 3C).

As this occurs, the potential of the capacitor is lower than the potential of the capacitive load when the capacitive load is charged, with no electric charge stored in the regenerative capacitor 224 due to power having just been applied. Therefore, since the diode SD1 between the switching element 212B and the capacitor 224 is not switched on even though the on-state resistance of the switching element 212B falls, the capacitive load is not charged by the potential of the capacitor, and hence, the capacitive load 200 is charged only by voltage from the second power supply 222 (see arrows B in FIG. 3B).

On the contrary, let's assume, for example, a case where with the capacitor being charged to gain its potential, the amplitude of an input signal Vin is set small and the capacitive load starts to be discharged after the capacitive load is charged to gain its potential. As a result of the amplitude of the input signal Vin being set small, since the diode SD2 is not switched on when the potential of the capacitive load resulting when it starts to be discharged is lower than the potential of the capacitor which remains charged until then, the capacitive load is discharged only to the GND 226 with no electric charge being discharged from the capacitive load to the capacitor.

In this way, the potential of the regenerative capacitor is determined by the capacitive load that is charged and discharged and is not controlled forcibly by an external factor. Therefore, even though the voltage of the capacitive load changes by changing the setting of the amplitude of the drive signal, the potential of the capacitor changes according to the voltage. Then, even though the amplitude of the input signal changes, by repeating a cycle of charging and discharging, in the potential of the capacitor, charging and discharging potentials become equilibrium at a potential close to an average value of the potential of the capacitor, whereby the capacitive load is charged by and discharged to the regenerative capacitor. As a result of this, even though the amplitude of the input signal changes or pulses having different amplitudes are repeated, a reduction in power consumption and a suppression of heat generation may be realized without fail through regeneration in the equilibrium. In the event that the potential of the capacitor is attempted to be forcibly controlled by an external factor, since current flows to maintain the potential of the capacitor at a predetermined potential, a power supply needs to be prepared separately which has a driving capability corresponding to the current. In contrast with this configuration, according to the invention, since the potential of the capacitor does not have to be maintained at such a predetermined potential, only one regenerative capacitor should be connected to the circuitry.

On the other hand, in discharging the capacitive load, with the potential of the capacitive load remaining higher than the potential of the capacitor, when the input signal Vin starts to decrease, although the third switching element 212C and the fourth switching element 212D are switched on, since the resistance of the fourth switching element 212D is lower than that of the third switching element 212C, the capacitive load 200 is discharged mainly to the regenerative capacitor through the discharging path D2 in preference to the discharging path D1. Thereafter, when the potential of the capacitive load approaches that of the capacitor, the diode SD2 starts to be off. Further, when the output of the differential amplifier 204 starts to fall, the on-state resistance of the third switching element 212C is reduced, whereby the diode SD2 is switched off. Thus, the capacitive load 200 is discharged only to the GND 226 (see arrows C and D in FIGS. 3B and 3C, respectively).

Hereinafter, the operation of the exemplary embodiment will be described.

Figure 3A:
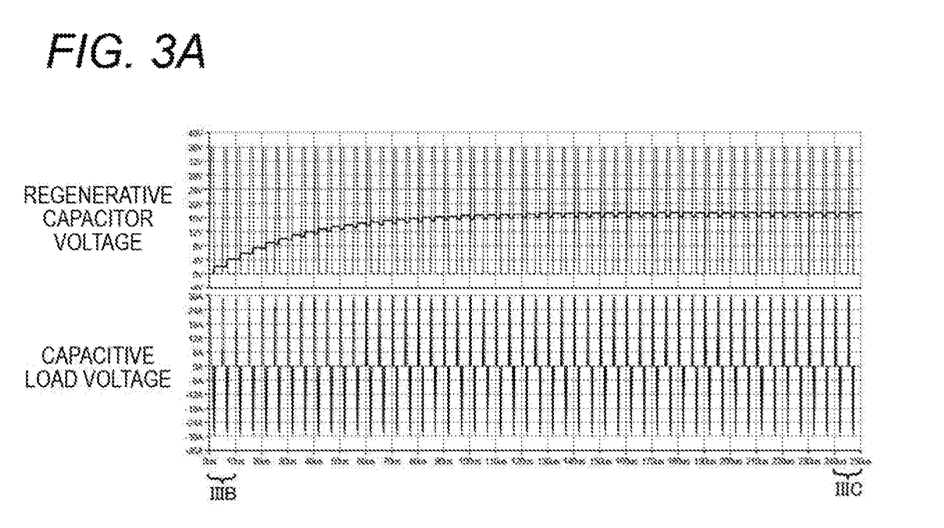
FIGS. 3A, 3B and 3C show characteristic diagrams showing operation characteristic curves in the capacitive load driving circuit according to the exemplary embodiment.

An upper part of a characteristic diagram shown in FIG. 3A is a characteristic curve showing a transition of the voltage of the capacitive load and the voltage of the regenerative capacitor based on the drive signal (the input voltage Vin) output from the differential amplifier 204.

Figure 3B:
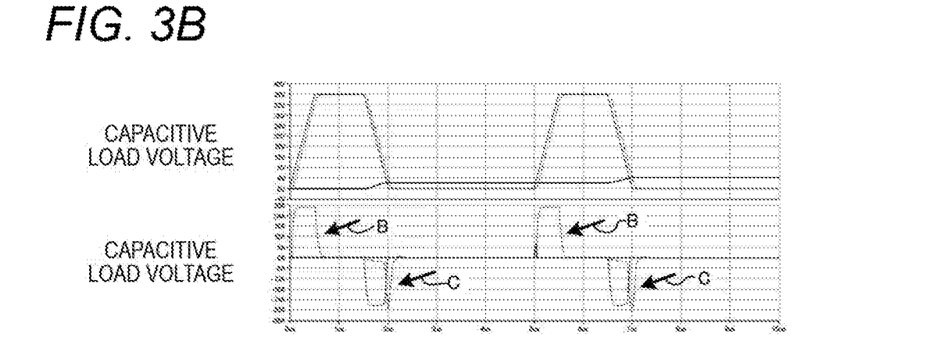
Figure 3C:
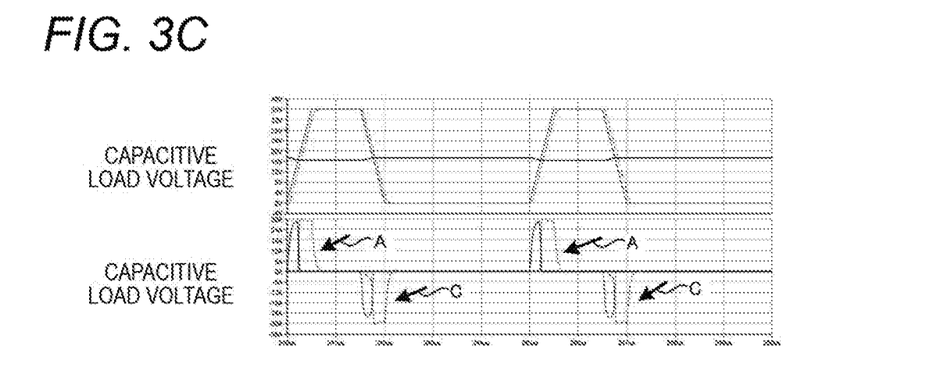

FIG. 3B is an enlarged view of a portion ranging from 0 μsec to 10 μsec in FIG. 3A, and FIG. 3C is an enlarged view of a portion ranging from 240 μsec to 250 μsec in FIG. 3A. These enlarged views show in detail a charge origin from which the capacitive load 200 is charged and a discharge destination to which the capacitive load 200 is discharged.

Flows of charging and discharging the capacitive load will be described by reference to FIGS. 3A to 3C.

"Rise" in Charging the Capacitive Load

In a time axis (an axis of abscissas) of FIG. 3B, the portion ranging from 0 μsec to 10 μsec shows a state where the regenerative capacitor 224 is not charged or is charged to a predetermined small charge amount or less (hereinafter, referred to as a non-charged state).

When the input signal Vin starts to rise in this state, the potentials at the gates of the first switching element 212A and the second switching element 212B rise, and since the potential of the control terminal (the gate) of the second switching element 212B, which is connected to the high potential side of the first voltage dropper element 216, is high, the on-state resistance of the second switching element 212B becomes small. As this occurs, however, the diode SD1 is not switched on because the potential of the capacitor is lower than that of the capacitive load, whereby the capacitive load is not charged through the second charging path C2. Due to this, the drive signal rises further, whereby the control voltage of the first switching element rises, causing the on-state resistance to fall. Thus, the capacitive load is charged only by the power supply 222 through the first charging path C1.

The capacitance of the capacitor 224 is set sufficiently greater than that of the capacitive load 200, and therefore, the potential of the capacitor 224 is not raised through one cycle of charging and discharging. However, the potential of the capacitor is raised nearly to one-half of the maximum voltage of the capacitive load where the potential is in equilibrium by repeating the cycle of charging and discharging only if the drive signal is the same. In the case of FIGS. 3A, 3B and 3C, by setting the capacitance of the capacitor 12.5 times greater than that of the capacitive load, the potential of the capacitor reaches such an equilibrium level by repeating the cycle of charging and discharging on the order of 30 times. With the capacitor being not charged at all whereby the potential of the capacitor remains vertically zero, the diode SD1 is not switched on, and the capacitive load is charged only by the power supply 222. This is similar to a case where no capacitor is provided. However, with the capacitor left charged, the capacitive load is charged by the capacitor in place of the power supply 222 while the potential of the capacitive load regains equal to or smaller than the potential of the capacitor, whereby the power supply current may be reduced. At the same time, since the third switching element 212C bears only a potential corresponding to a difference in potential between the capacitor and the capacitive load, the potential borne by the third switching element 212C is smaller than a difference in potential between the supply voltage 211 and the capacitive load, whereby the amount of heat generated by the transistor may be reduced. In addition, a difference in potential between source drains of the second switching element 212B may be made smaller than the potentials of the power supply 222 and the capacitive load when the capacitive load is charged by the capacitor, whereby the amount of heat generated by the second switching element 212B may also be suppressed.

On the other hand, when the capacitive load is discharged, the capacitive load is discharged to the capacitor while the potential of the capacitive load is higher than the potential of the capacitor. As this occurs, the fourth switching element 212D bears a potential corresponding to the potential difference between the capacitive load and the capacitor irrespective of the current of the power supply 222. Then, since the potential borne by the fourth switching element 212D is smaller than the potential difference between the capacitive load and the GND, the fourth switching element 212D may be restrained from generating heat.

In the case of FIGS. 3A, 3B and 3C, with the capacitance of the capacitor set 12.5 times as large as the capacitive load, the equilibrium is reached by repeating the cycle of charging and discharging on the order of 30 times. Then, the power consumption may be reduced to the least when the potential is in equilibrium, and the generation of heat from the transistor may also be reduced. This effect may be provided by repeating the cycle of charging and discharging on the order of 10 times. This number of equilibrium becomes in equilibrium at the reduced when the capacitance of the capacitor to the load capacitance is reduced. However, when the capacitance of the capacitor is set too small, the amount of electric charge stored when it is charged becomes small, whereby the regeneration effect is limited. On the other hand, when the capacitance of the capacitor is set too great, it takes more time until the equilibrium is reached, and hence, it takes some time before the regeneration effect is apparent. Depending on an image, the capacitor needs to be driven intermittently. As this occurs, although the capacitor is charged over a long period of time, when a rest period continues for some time after the capacitor has been charged, the potential of the capacitor falls through leakage, and it becomes difficult for the regeneration effect to become apparent. Thus, it is desirable that the capacitance of the capacitor is on the order of tens of times the capacitance of the capacitive load.

In the time axis (the axis of abscissas) of FIG. 3C, the portion ranging from 240 μsec to 250 μsec shows a state where the regenerative capacitor 224 is almost charged fully (hereinafter, referred to as a charged state).

When the drive signal starts to rise in this state, the potentials at the gates of the first switching element 212A and the second switching element 212B rises, and since the potential of the control terminal (the gate) of the second switching element 212B, which is connected to the high potential side of the first voltage dropper element 216, is high, the on-state resistance of the second switching element 212B is reduced further to a lower level. Further, since the potential of the capacitor 224 is higher than the potential of the capacitive load 200, the diode SD1 is switched on, the capacitive load is charged by the capacitor 224 mainly through the first charging path C1. Then, when the potential of the capacitive load approaches the potential of the capacitor, the diode SD1 starts to be off. When the driving voltage increases further to reduce the on-state resistance of the first switching element 212A, the capacitive load continues to be charged since then only through the first charging path C1 until the driving voltage takes a constant value.

Namely, in this embodiment, an auxiliary power supply which is separate from the second power supply 222 does not have to be prepared as an alternative to a case where the regenerative capacitor 224 is not charged and the operation (the ink droplet ejecting operation) of the capacitive load 200 may be controlled stably from 0 μsec.

"Fall" in Discharging the Capacitive Load

In the time axis (the axis of abscissas) of FIG. 3B, the portion ranging from 0 μsec to 10 μsec shows the state where the regenerative capacitor 224 is not charged or is charged to the predetermined small charge amount or less (hereinafter, referred to as the non-charged state).

When the input drive signal starts to fall in this state, a gate voltage is applied to the third switching element 212C, which is the p-type MOSFET, and the fourth switching element 212D, which is the p-type MOSFET. However, since a lower voltage is applied to the control terminal (the gate) of the fourth switching element 212D, which is connected to the low potential side of the second voltage dropper element 218, the on-state resistance of the fourth switching element 212D is reduced to a low level. Further, since the potential of the capacitive load is higher than the potential of the capacitor, the diode SD2 is switched on, whereby the capacitive load is discharged mainly through the second discharging path D2 by way of the fourth switching element 212D. Then, when the capacitive load continues to be discharged to such an extent that the potential of the capacitive load approaches the potential of the capacitor, the diode SD2 starts to be off. A further continuous fall in driving voltage reduces the gate potential of the third switching element 212C, reducing in turn the on-state resistance of the third switching element 212C. Thereafter, the capacitive load is discharged through the first discharging path D1 by way of the third switching element 212C until the driving voltage becomes a predetermined value.

In the range of 0 μsec to 10 μsec, since the regenerative capacitor 224 is not charged when the capacitive load is discharged, the capacitive load 200 is discharged mainly to the regenerative capacitor 224, and the regenerative capacitor 224 is charged accordingly.

Thereafter, when the potential of the capacitive load approaches the potential of the capacitor, the diode SD2 starts to be off. A further continuous fall in driving voltage reduces the potential at the control terminal of the third switching element 212C, whereby the on-state resistance of the third switching element 212C falls. Then, the capacitive load continues to be discharged by way of the first discharging path D1 until the drive signal takes a constant value. In the range of 0 μsec to 10 μsec, since the charge amount of the capacitive load 200 is small, the capacitive load is discharged more to the regenerative capacitor 224 than to the ground 226. This allows the potential of the capacitor to reach the equilibrium quicker, thereby making it possible to reduce the time taken until the regenerative effect becomes apparent.

The potential of the regenerative capacitor 224 approaches the equilibrium in charging and discharging as a result of the drive signal rising and falling repeatedly.

In the time axis (the axis of abscissas) in FIG. 3B, a portion ranging from 240 μsec to 250 μsec shows that the regenerative capacitor 224 is charged and discharged equally and then approaches the equilibrium.

When the drive signal starts to fall in this state, a negative gate voltage is applied to the sources of the third switching element 212C and the fourth switching element 212D. However, a lower voltage is applied to the control terminal (the gate) of the fourth switching element 212D, which is connected to the low potential side of the second voltage dropper element 218, whereby the on-state resistance of the fourth switching element 212D remains low. Then, the diode SD2 is left on while the potential of the capacitive load is higher than the potential of the capacitor, whereby the capacitive load is discharged mainly through the second discharging path D2 by way of the fourth switching element 212D. Then, when the potential of the capacitive load approaches the potential of the capacitor, the diode SD2 starts to be off. A further continuous fall in the drive signal, the on-state resistance of the third switching element 212C falls, and in this case, the capacitive load is discharged by way of the first discharging path D1 via the third switching element 212C until the drive signal takes a constant value.

Namely, when the capacitive load is discharged according to this embodiment, with the potential of the capacitive load being higher than the potential of the regenerative capacitor 224, the capacitive load is discharged to the regenerative capacitor 224 preferentially. Then, when the potential of the capacitive load approaches the potential of the regenerative capacitor, the diode SD2 starts to be off, and the capacitive load of the discharging path D1 is discharged to the ground 226. Although the power supply current is not reduced while the capacitive load is discharged, since the capacitive load is continuously discharged by way of the fourth switching element 212D until the potential of the capacitive load approaches the potential of the capacitor, the capacitor bears only a potential corresponding to a difference in potential between the capacitor and the capacitive load. This potential difference is smaller than a difference in potential between the GND and the capacitive load and hence works to provide an effect of reducing the generation of heat by the transistor.

Capacitance Relationship Between Capacitive Load 200 and Regenerative Capacitor 224

An axis of abscissas of a characteristic curve shown in FIG. 4 denotes a capacity ratio of a capacitance of the capacitive load 200 (hereinafter, referred to as a capacitive load capacitance) to a capacitance of the regenerative capacitor 224 (hereinafter, referred to as a regenerative capacitance) (regenerative capacitance/load capacitance). When the capacitance of the regenerative capacitor is zero, the capacity ratio becomes minimum, where no regeneration effect is provided.

Figure 4:
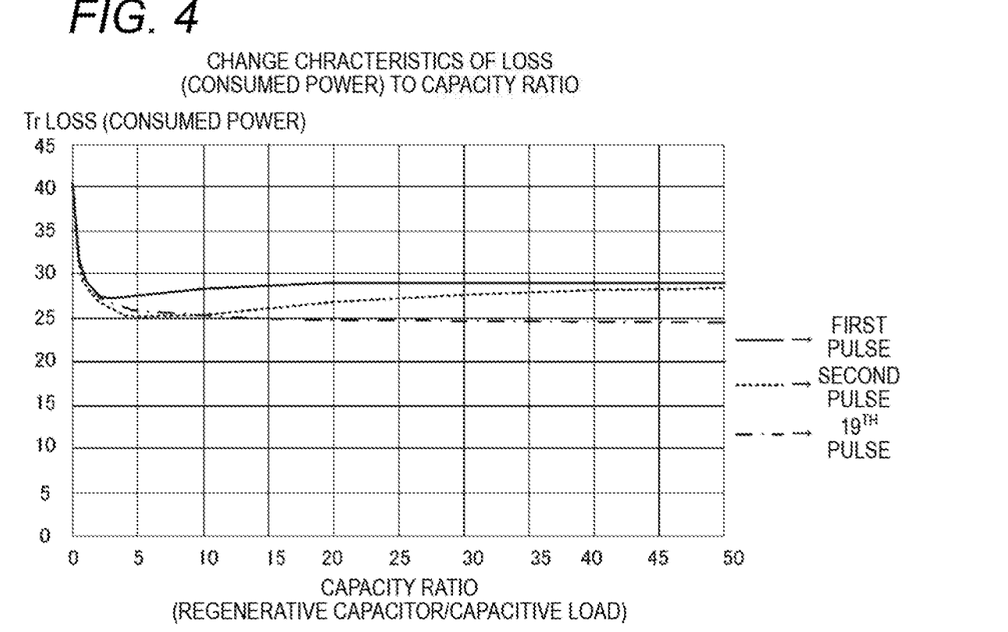
FIG. 4 is a characteristic diagram showing capacity ratio to loss (power consumption) characteristic curves according to the exemplary embodiment.

An axis of ordinates of the characteristic curve shown in FIG. 4 denotes a sum of loses of the four switching elements 212, that is, power consumption. For example, in an experiment where the regenerative load driving circuit according to the embodiment is mourned, the sum of the losses (the power consumption) when the regenerative capacity on the axis of abscissas is zero is 40.7 W, which constitutes a value prior to improvement where no regeneration is provided.

Three curves shown in FIG. 4 represent power consumption resulting when pulses of the drive signal is inputted repeatedly. A curve produced by a first pulse denotes power consumption when the first pulse is inputted. The regenerative capacitor then is not charged, and therefore, the regenerative effect is small. However, with a 19th pulse, the regenerative capacitor is charged, and the effect of the embodiment (the reduction in power consumption) becomes apparent.

When the regenerative capacitance is small (as an example, a capacitance smaller than a capacitance which is charged fully through input of the order of 10 pulses), the regeneration effect becomes maximum through input of a small number of pulses. However, the effect of reducing power consumption through regeneration becomes small.

On the other hand, when the regenerative capacitance is great (as an example, a capacitance greater than a capacitance which is charged fully through input of the order of 50 pulses), since the regenerative capacitor is not charged sufficiently through input of a small number of pulses, the effect of reducing power consumption does not become apparent with a small number of pulses.

More the number of pulses increases, the greater the effect of reducing power consumption may be expected. However, this theory may be applicable only if a continuous driving is performed. With an intermittent driving, the potential of the capacitor is reduced through leakage caused when the driving is stopped. Then, to start the next driving, the regenerative capacitor needs to be charged from nothing or a reduced level. Additionally, to achieve a great capacitance, parts involved unfavorably need to be enlarged in size. Thus, it is desirable to achieve a regenerative capacitor capacitance having a required minimum size to obtain a sufficient regenerative effect.

To make this happen, when selecting an area where the regenerative capacitance is small under a condition that the regenerative capacity remains around Trloss=25 W where the power consumption gets saturated, the regenerative effect starts to be apparent within a short period of time, and a great power consumption reduction effect through regeneration may be obtained.

The three types of curves shown in FIG. 4 show a tendency that the power consumption relative to the capacity ratio temporarily reaches a minimum point and then increases to be stable (a horizontal state).

The reason is the number of pulses used to calculate power consumption is small. With a small regenerative capacitance, the regenerative capacitor is charged irrespective of a small number of pulses, whereby the power consumption reduction effect through regeneration easily becomes apparent. However, with a great regenerative capacitance and a small number of pulses, the regenerative capacitor cannot be charged easily, and the power consumption reduction effect is reduced.

Based on what has been described heretofore, in this embodiment, the number of pulses enabling the regenerative capacitor to be charged fully is preferably 10 pulses or greater and 50 pulses or smaller. In other words, the regenerative capacitance is preferably a capacitance which is fully charged through input of 10 pulses or greater and a capacitance which is fully charged through input of 50 pulses or smaller. However, this does not exclude a capacitance smaller than the capacitance which is fully charged through input of 10 pulses and a capacitance which is greater than the capacitance which is fully charged through input of 50 pulses. In short, the capacitance should be set at a capacitance which may achieve an intended power consumption reduction effect. The range (10 pulses or greater and 50 pulses or smaller) described above should be an initial target in installing the capacitive load driving circuit according to the embodiment.

A schottky type diode having a small forward voltage drop should be used for the diode SD1 and the diode SD2 along the second charging path C2 and the second discharging path D2 to prevent a back flow because the schottky type diode loses less and the regeneration efficiency may be increased. However, a PN diode may also be used for the diodes SD1 and SD2 without any problem.

First Modified Example: Not Using Negative Feedback Circuit

Figure 5:
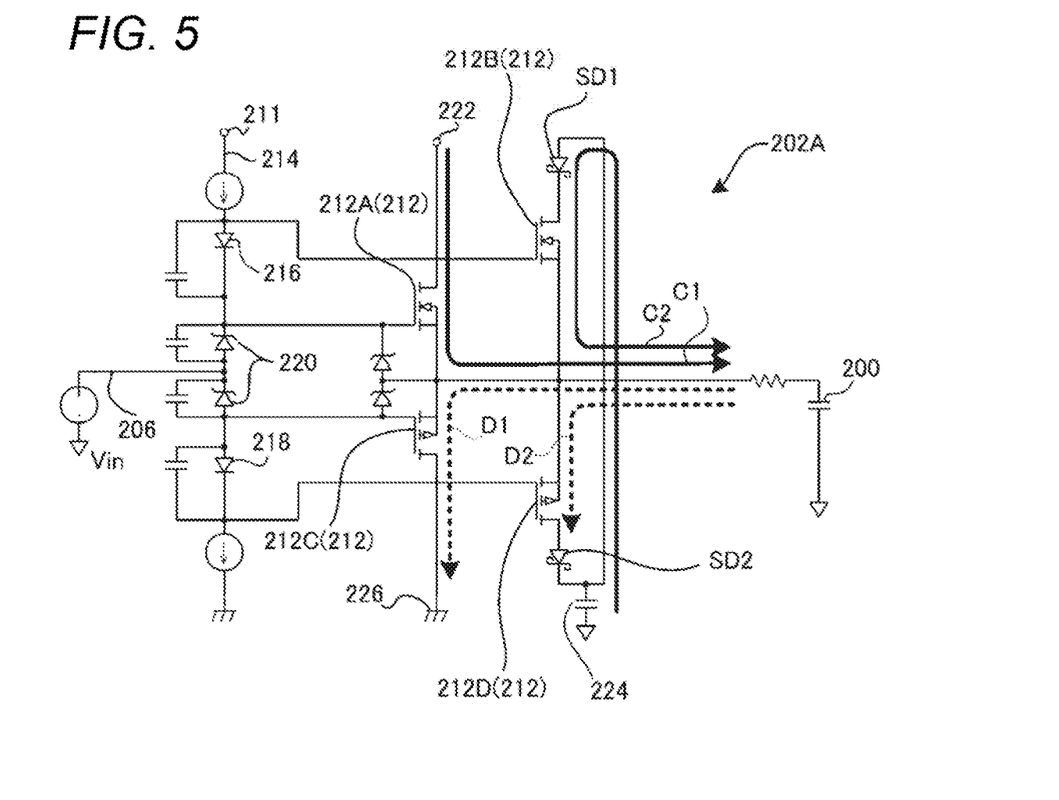
FIG. 5 is a circuit diagram of a capacitive load driving circuit according to a first modified example which is configured to drive a capacitive load for ejecting a droplet of ink.

In the embodiment, the signal line for negative feedback of the voltage driving the capacitive load 200. However, as shown in FIG. 5, when the accuracy achieved by negative feedback is not necessary or a feedforward control is adopted in which a control signal Vin is corrected in advance so as to obtain a target waveform, a capacitive load driving circuit 202A having no signal line for negative feedback may be adopted.

In the capacitive load driving circuit diagram shown in FIG. 2, the first voltage dropper element 216 and the second voltage dropper element 218 each include the two diodes. In a capacitive load driving circuit diagram shown in FIG. 5, however, a first voltage dropper element 216 and a second voltage dropper element 218 each include a single diode. The reason that the single diode is used is that compared with the capacitive load driving circuit 202 shown in FIG. 2 in which the negative feedback circuit is provided, in the capacitive load driving circuit 202A according to a first modified example, a potential difference between a pair of switching elements 212 should be small. When this potential difference is too small, a difference in on-state resistance between charging paths C1 and C2 or discharging paths D1 and D2 becomes small, reducing the priority thereof, whereby the regenerative effect is reduced. On the other hand, when the potential difference is too great, a switching between the charging paths C1 and C2 and between the discharging paths D1 and D2 is discontinuous, generating a waveform distortion such as a crossover distortion. Thus, an optimum value needs to be selected in consideration of the drawbacks described above.

In addition, in the first modified example, only the signal line 208 for negative feedback and the differential amplifier 204 of the embodiment (see FIG. 2) are made unnecessary, and the other circuit configurations remain the same. Thus, like reference numerals are given to those like circuit configurations, and the description thereof will be omitted here.

Second Modified Example 2: Using a Bipolar Transistor

In the exemplary embodiment (see FIG. 2), the MOSFET is used as the switching elements 212. More specifically, the n type MOSFET is used for the first switching element 212A and the second switching element 212B. Then, the capacitive load is charged through the second charging path C2 by way of the switching element 212B preferentially by the first voltage dropper element 216 while the potential of the capacitive load is lower than the potential of the capacitor. The p type MOSFET is used for the third switching element 212C and the fourth switching element 212D. Then, the capacitive load is discharged through the second discharging path D2 by way of the fourth switching element 212D preferentially by the second voltage dropper element 218 while the potential of the capacitive load is higher than the potential of the capacitor.

Figure 6:
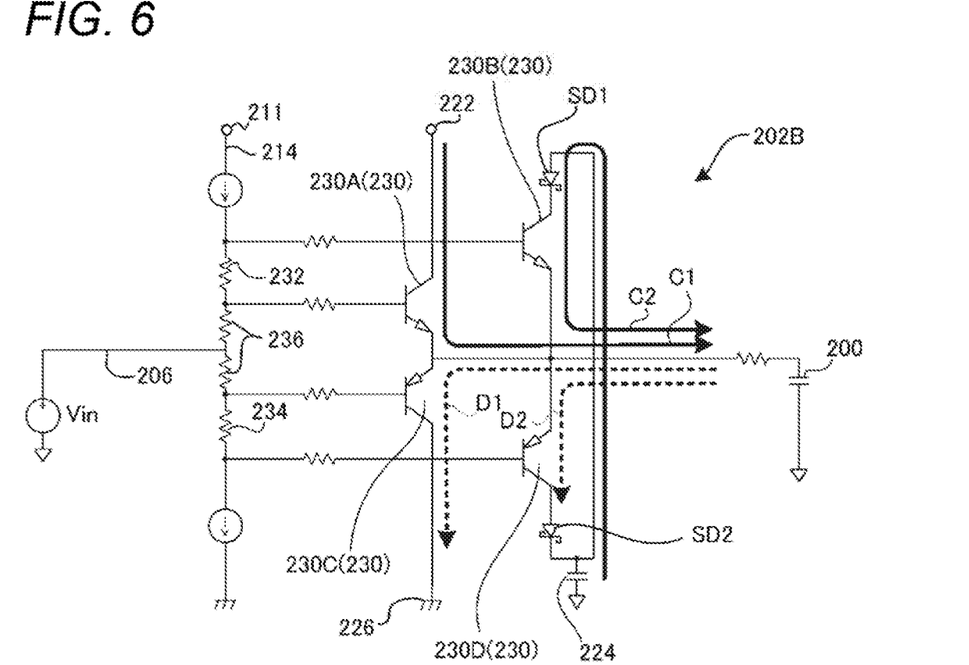
FIG. 6 is a circuit diagram of a capacitive load driving circuit according to a second modified example which is configured to drive a capacitive load for ejecting a droplet of ink.

In contrast, a bipolar transistor is used as a switching element 230 in a capacitive load driving circuit 202B according to a second modified example, as shown in FIG. 6.

More specifically, when a capacitive load is charged, an NPN type transistor is used for a first switching element 230A and a second switching element 230B. Then, a base current of the second switching element is set so as to be greater than a base current of the first switching element by a first voltage dropper element 232. Therefore, the capacitive load is charged by a capacitor through a second charging path C2 preferentially while the potential of the capacitive load is lower than the potential of the capacitor. Then, when the potential of the capacitive load approaches the potential of the capacitor, a diode SD1 starts to be off. Then, a further rise in a drive signal increases the base current of the first switching element 230A, enabling a greater current to flow. The capacitive load is charged by a power supply 222 through a first charging path C1 after the diode SD1 is switched off.

On the other hand, when the capacitive load is discharged, a PNP type transistor is used for a third switching element 230C and a fourth switching element 230D. Then, a base current of the fourth switching element is set so as to be greater than a base current of the third switching element by a second voltage dropper element 234. Therefore, the capacitive load is discharged to the capacitor through a second discharging path D2 preferentially while the potential of the capacitive load is higher than the potential of the capacitor. Then, when the potential of the capacitive load approaches the potential of the capacitor, a diode SD2 starts to be off. Then, a further fall in the drive signal increases the base current of the switching element 230C, enabling a greater current to flow. The capacitive load is discharged to a ground through a first discharging path D1 after the diode SD2 is switched off.

In the case of a complementary configuration made up of a bipolar transistor, since a VBE potential by which the transistor is switched on is smaller than a VGS potential of a MOSFET, when attempting to cause a complementary circuit to perform a class-B operation so that power consumption is not increased, a resistance 236 configured to produce a difference in potential between a base of the first switching element 230A and a base of the third switching element 232C has to be set so that the NPN transistors 230A and 230B and the NPN transistors 230C and 230D are not switched on simultaneously. The resistance configured to set a potential difference may be driven by a constant current to generate the same potential difference irrespective of its operating point.

When the resistances 232, 234, 236 are set so that the NPN second switching element 230B and the PNP fourth switching element 230D are switched on simultaneously by causing the complementary circuit to perform a class-AB operation instead of the class-B operation, the capacitive load and the regenerative capacitor are caused to electrically communicate with each other via the diodes SD1 and SD2, whereby the effect of the regenerative capacitor 224 is lost.

To avoid the drawback described above, in the second modified example, the resistance 232 is used as the first voltage dropper element, the resistance 234 is used as the second voltage dropper element, and the resistance 236 is used as a third voltage dropper element. Resistance values of the resistance 232 and the resistance 234 are determined so that the PNP transistors and the NPN transistors are not switched on simultaneously. With the resistance value being zero, the PNP and NPN transistors are not switched on simultaneously, and therefore, in case a distortion is not so crucial, the resistance value may be zero.

Although the bipolar transistors are used, a basic operation of the capacitive load driving circuit 202B remains the same. Similarly, when the initial voltage of the regenerative capacitor 224 is 0V, the capacitive load is not charged by the regenerative capacitor 224 by way of the second switching element 230B. In a range from 240 μsec to 250 μsec where the potential of the regenerative capacitor 224 reaches the equilibrium by repeating a cycle of charging and discharging, to charge the capacitive load, the diode SD1 is switched on, so that the capacitive load is charged by way of the second charging path C2 mainly until the potential of the capacitive load approaches the potential of the capacitor while the potential of the capacitive load remains lower than the potential of the capacitor after a drive signal 206 starts to rise. Then, when the potential of the capacitive load approaches the potential of the capacitor, the diode SD1 starts to be off. When the driving potential rises further, the first switching element 230A is switched on this time. Then, the diode SD1 is switched off, whereafter the capacitive load continues to be charged through the first charging path C1 until the drive signal 206 reaches a predetermined value.

On the other hand, to discharge the capacitive load, the diode SDI is switched on, so that the capacitive load is discharged by way of the second discharging path D2 mainly to the capacitor while the potential of the capacitive load remains higher than the potential of the capacitor after the drive signal 206 starts to fall. Then, when the potential of the capacitive load falls and the potential of the capacitive load approaches the potential of the capacitor, the diode SD2 starts to be off. When the drive signal falls further, the third switching element 230C is switched on. Then, after the diode SD2 is switched off, the capacitive load continues to be discharged to the ground 226 through the first discharging path D1 until the drive signal reaches a predetermined value.

Thus, as described above, no negative feedback circuit is provided in the first modified example and the second modified example. In either of these modified examples, an offset may occur. To reduce the offset towards zero without negative feedback, a voltage dropper element is sometimes inserted to balance the offset. However, for example, adopting a method of using a diamond circuit of a bipolar transistor results in a class-AB operation, whereby consumed energy is wasted. Due to this, adopting a negative feedback circuit in parallel enables the offset to approach zero by the class-B operation.

Specifically, with a negative feedback circuit provided (the embodiment shown in FIG. 2), the two PN diodes are used for each of the first voltage dropper element 216 and the second voltage dropper element 218. On the other hand, with no negative feedback circuit provided (the first modified example), the single PN diode is used for each of the first voltage dropper element 216 and the second voltage dropper element 218. For example, the greater the potential difference between the first switching element 212A and the second switching element 212B, the lower the on-state resistance of the second switching element 212B, whereby the capacitive load 200 is charged dominantly by way of the second switching element 212B, resulting in a great regenerative effect. Apparent switching between the first switching element 212A and the second switching element 212B may result in great distortion when the first switching element 212A and the second switching element 212B are switched over, but, the distortion may be suppressed through negative feedback. On the other hand, even with one diode, in case, for example, a mutual conductance Gm of a MOSFET is great and a difference in on-state resistance may be increased to be great, then, two or more diodes do not have to be provided. In this case, the accuracy of the offset is increased as an effect of applying the negative feedback.

Third Modified Example: Minus Driving Circuit

Figure 7:
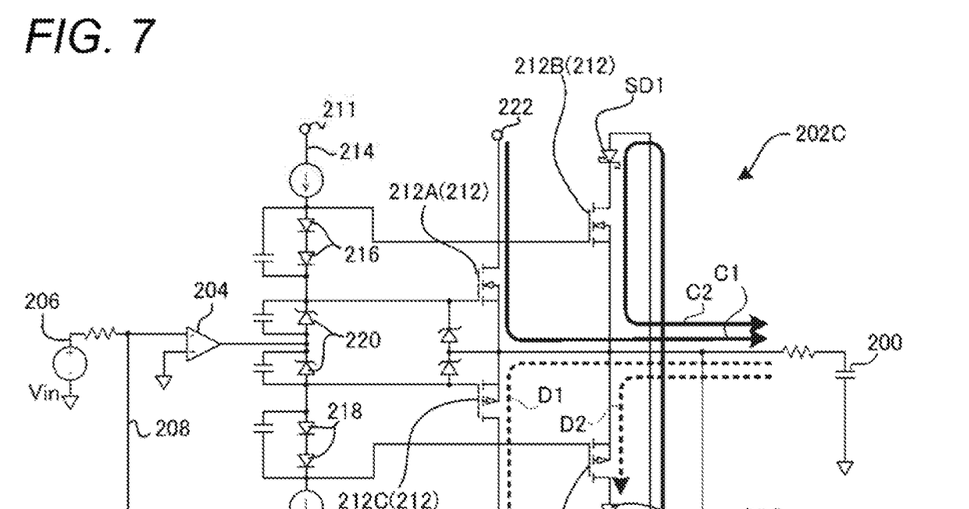
FIG. 7 is a circuit diagram of a capacitive load driving circuit according to a third modified example which is configured to drive a capacitive load for ejecting a droplet of ink.

FIG. 7 shows a capacitive load driving circuit 202C in which a capacitive load 200 has a minus voltage as a third modified example. In the case of this capacitive load driving circuit 202C, the supply voltage of the capacitive load driving circuit 202 according to the embodiment should be reversed to a minus side.

In this case, as in the capacitive load driving circuit 202 according to the embodiment, when a differential amplifier is connected as a non-reversible amplifier, the differential amplifier is also caused to operate to the minus side. Thus, for example, assuming that an input of the differential amplifier is connected to a digital-to-analogue (DA) converter, when the differential amplifier is a rail-to-rail differential amplifier, the DA converter may be driven at 5V, whereby a level conversion with a logic is facilitated.

Then, in the capacitive load driving circuit 202C according to the third modified example, the differential amplifier is configured as a reversible amplifier, and a gain is set at −20 times in consideration of a dynamic range of the DA converter.

Figure 8A:
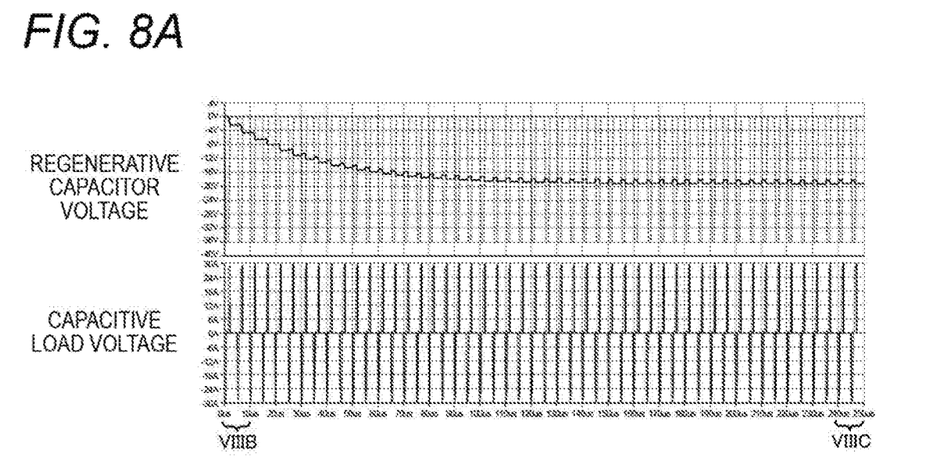
FIGS. 8A, 8B and 8C are characteristic diagrams showing operation characteristic curves in the capacitive load driving circuit according to the third modified example.
Figure 8B:
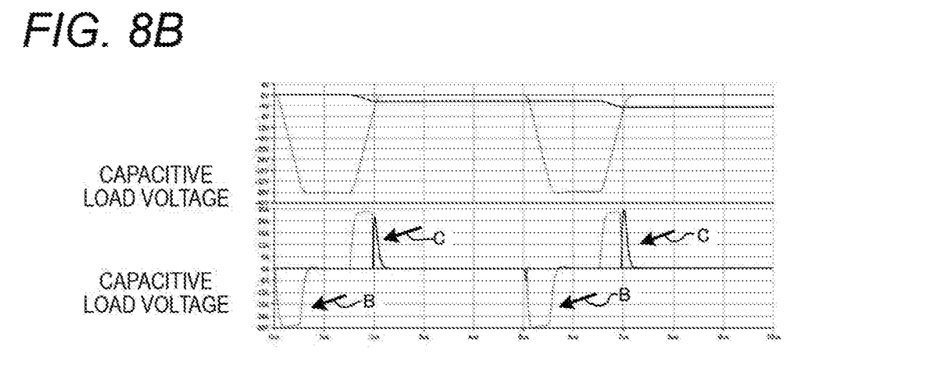
Figure 8C:
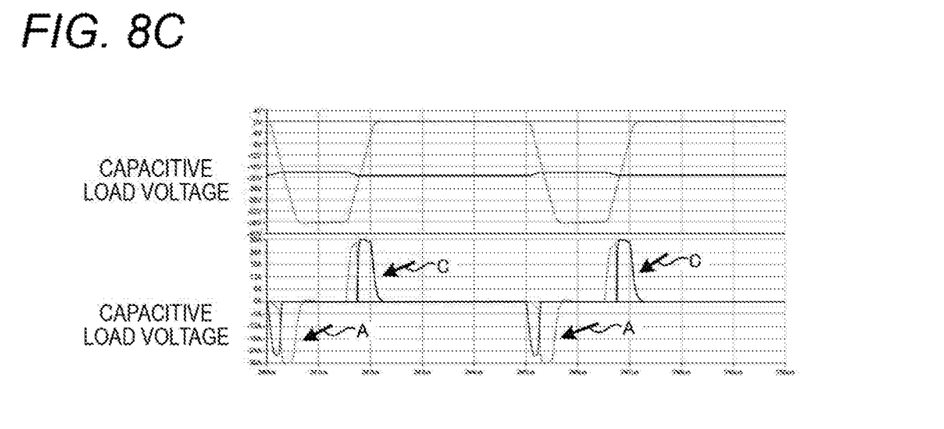

Even with the minus driving, as shown in FIGS. 8A, 8B and 8C, the operation of the minus capacitive load driving circuit remains the same as the operation of the exemplary embodiment (see FIGS. 3A, 3B and 3C) with an exception that plus and minus are reversed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A capacitive load driving circuit for charging and discharging a capacitive load repeatedly based on a control signal, the capacitive load driving circuit comprising:
   a first switching element that is interposed on a first charging path through which electric current flows from a charging power supply to the capacitive load, the charging power supply being configured to charge the capacitive load;
   a second switching element that is interposed on a second charging path through which electric current flows from a capacitor to the capacitive load, the electric current being rectified by a first back flow preventing diode;
   a third switching element that is interposed on a first discharging path through which electric current flows from the capacitive load to a ground;
   a fourth switching element that is interposed on a second discharging path through which electric current flows from the capacitive load to the capacitor, the electric current being rectified by a second back flow preventing diode;
   a first voltage dropper element that is provided between the first switching element and the second switching element on a voltage input path to a control terminal configured to indicate an on-state based on an input signal; and
   a second voltage dropper element that is provided between the third switching element and the fourth switching element on a voltage input path to a control terminal configured to indicate an on-state based on an input signal,
   wherein a control terminal of the first switching element is connected to a low potential side of the first voltage dropper element,
   a control terminal of the second switching element is connected to a high potential side of the first voltage dropper element,
   a control terminal of the third switching element is connected to a low potential side of the second voltage dropper element, and
   a control terminal of the fourth switching element is connected to a high potential side of the second voltage dropper element.

2. The capacitive load driving circuit according to claim 1, further comprising:
   a third voltage dropper element,
   wherein the control terminal of the first switching element is connected to a high potential side of the third voltage dropper element, and
   the control terminal of the third switching element is connected to a low potential side of the third voltage dropper element.

3. The capacitive load driving circuit according to claim 1, comprising:
   a differential amplifier that generates a control signal and applies the control signal to the capacitive load driving circuit, and
   a signal line for negative feedback of a voltage driving the capacitive load to the differential amplifier.

4. The capacitive load driving circuit according to claim 2, comprising:
- a differential amplifier that generates a control signal and applies the control signal to the capacitive load driving circuit, and
- a signal line for negative feedback of a voltage driving the capacitive load to the differential amplifier.

5. An image forming apparatus comprising:
- an ejecting unit that ejects a droplet of liquid onto a recording medium by driving the capacitive load with the capacitive load driving circuit according to claim 1.

6. An image forming apparatus comprising:
- an ejecting unit that ejects a droplet of liquid onto a recording medium by driving the capacitive load with the capacitive load driving circuit according to claim 2.

7. An image forming apparatus comprising:
- an ejecting unit that ejects a droplet of liquid onto a recording medium by driving the capacitive load with the capacitive load driving circuit according to claim 3.

8. An image forming apparatus comprising:
- an ejecting unit that ejects a droplet of liquid onto a recording medium by driving the capacitive load with the capacitive load driving circuit according to claim 4.

* * * * *